(12) United States Patent
Kamiya et al.

(10) Patent No.: US 9,366,962 B1
(45) Date of Patent: *Jun. 14, 2016

(54) NEGATIVE-WORKING LITHOGRAPHIC PRINTING PLATE PRECURSOR AND USE

(71) Applicant: Eastman Kodak Company, Rochester, NY (US)

(72) Inventors: Masamichi Kamiya, Oura-gun (JP);
Koji Hayashi, Tatebasyashi (JP);
Yoshiaki Shekiguchi, Kumagaya (JP);
Eiji Hayakawa, Utsunomiya (JP)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/642,876

(22) Filed: Mar. 10, 2015

(51) Int. Cl.
*G03F 7/00* (2006.01)
*G03F 7/038* (2006.01)
*G03F 7/20* (2006.01)

(52) U.S. Cl.
CPC ............... *G03F 7/0388* (2013.01); *G03F 7/20* (2013.01)

(58) Field of Classification Search
CPC ...................................................... G03F 7/11
See application file for complete search history.

(56) References Cited

U.S. PATENT DOCUMENTS

| 6,899,994 | B2 | 5/2005 | Huang et al. |
| 7,097,956 | B2 | 8/2006 | Miyamoto et al. |
| 7,361,451 | B2 | 4/2008 | Oshima et al. |
| 7,524,614 | B2 | 4/2009 | Tao et al. |
| 2005/0003285 | A1 | 1/2005 | Hayashi et al. |
| 2010/0009130 | A1* | 1/2010 | Yu ........................ B41C 1/1016 428/195.1 |

FOREIGN PATENT DOCUMENTS

| JP | 2006-215119 | 8/2006 |
| JP | 2007-310291 | 11/2007 |

* cited by examiner

*Primary Examiner* — Chanceity Robinson
(74) *Attorney, Agent, or Firm* — J. Lanny Tucker

(57) ABSTRACT

A negative-working, infrared radiation-sensitive lithographic printing plate precursor is exposed and processed on-press to provide a lithographic printing plate. This precursor has an infrared radiation-sensitive imageable layer comprises free radical imaging chemistry; an infrared radiation absorber; a particulate primary polymeric binder comprising polyalkylene oxide segments having an average particle size ($D_1$) of at least 50 nm and up to and including 1000 nm; and a particulate secondary resin having an average particle size ($D_2$) of at least 3 μm and up to and including 10 μm. The imageable layer has an average dry thickness (t) of at least 1 μm and up to and including 4 μm and satisfies Equation (1):

$$D_2/1.4 > t > D_1 \quad (1)$$

and the average dry thickness (t) is defined by Equation (2):

$$t = w/r \quad (2)$$

wherein w is the dry coverage of the imageable layer in g/m² and r is 1 g/cm³.

11 Claims, No Drawings

NEGATIVE-WORKING LITHOGRAPHIC PRINTING PLATE PRECURSOR AND USE

RELATED APPLICATION

Reference is made to U.S. Ser. No. 14/642,863 filed on Mar. 10, 2015, by Savariar-Hauck, Bruemmer, and Heinrich and entitled "Infrared Radiation-Sensitive Lithographic Printing Plate Precursors," the disclosure of which is incorporated herein by reference.

FIELD OF THE INVENTION

This invention relates to negative-working, infrared radiation-sensitive lithographic printing plate precursors that can be imaged using suitable infrared radiation and then processed on-press. This invention also relates to methods for preparing lithographic printing plates from such precursors.

BACKGROUND OF THE INVENTION

In lithographic printing, lithographic ink receptive regions, known as image areas, are generated on a hydrophilic surface. When the hydrophilic surface is moistened with water and lithographic ink is applied, the hydrophilic regions retain the water and repel the lithographic ink and the lithographic ink receptive regions accept the lithographic ink and repel the water. The lithographic ink is then transferred to the surface of suitable materials upon which the image is to be reproduced. In some instances, the lithographic ink can be first transferred to an intermediate blanket that in turn is used to transfer the lithographic ink to the surface of the materials upon which the image is to be reproduced.

Lithographic printing plate precursors useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer (processing solution), revealing the underlying hydrophilic surface of the substrate. If the exposed regions are removed, the precursor is considered as positive-working. Conversely, if the non-exposed regions are removed, the precursor is considered as negative-working. In each instance, the regions of the imageable layer(s) that remain are lithographic ink-receptive, and the regions of the hydrophilic surface revealed by the developing process accept water or aqueous solutions (typically a fountain solution), and repel lithographic ink.

"Laser direct imaging" methods (LDI) are used to directly form an offset lithographic printing plate or printing circuit board using digital data from a computer. There have been considerable improvements in this field from use of more efficient lasers, improved imageable layer compositions and components thereof, and improved processing solutions (developers) and procedures.

Various radiation-sensitive compositions are used in negative-working lithographic printing plate precursors as described in numerous publications such as U.S. Pat. No. 7,097,956 (Miyamoto et al.). Many other publications provide details about such negative-working radiation-sensitive compositions comprising necessary imaging chemistry dispersed within suitable polymeric binders. After imaging, the negative-working lithographic printing plate precursors are developed (processed) to remove the non-imaged (non-exposed) regions of the imageable layer.

Negative-working lithographic printing plate precursors that can be imaged and processed on-press during lithographic printing are also known to contain particulate polymeric binders. On-press developable imaged precursors also depend upon properties of the lithographic printing ink/fountain solution emulsion to develop (remove) non-exposed regions during the initial printing impressions. The resulting lithographic printing plates should exhibit good ink receptivity in the imaged (exposed) regions of the printing surface and at the same time exhibit sufficient developability in the non-exposed (non-imaged) regions, especially in the shadows of the printing image.

For on-press developable negative-working lithographic printing plate precursors, the use of polymeric binder in the negative-working imageable layer comprising pendant polyalkylenes oxide segments, as described for example in U.S. Patent Application Publication 2005-0003285 (Hayashi et al.), have been found to be especially useful to provide solvent resistance and higher run length. Such polymeric binders can be present in particulate form. The benefit of using binders in particulate form over using non-particulate binders is described in U.S. Pat. No. 6,899,994 (Huang et al.).

Negative-working lithographic printing plate precursors that can be imaged and processed on-press can also contain various particulate organic or inorganic filler materials in the imageable layers as described in U.S. Pat. No. 7,361,451 (Oshima et al.). As it can be seen from the working examples and comparative examples of this publication, the primary effect alleged to be achieved from addition of the filler materials is faster development speed on press. The filler materials used in the examples include those with particle size as big as 3 µm in Example 7 that is far above the average dry thickness of 1.2 µm, and those with particle size as small as 0.02 µm as in Example 5 is far below the average dry thickness of 0.7 µm. It can also be seen from these examples that the presence of the filler materials has little or no effect on the printing durability. Furthermore, all examples used binders in non-particulate form or microcapsules that encapsulate polymerizable monomers or other components that are essential for free radical polymerization.

In order to reduce the energy requirements for imaging negative-working lithographic printing plate precursors using infrared lasers, processing on-press, and providing adequate printing durability on press, various advanced free radical initiator compositions have become available. For example, a free radical initiator composition comprising iodonium-borate complex is taught in U.S. Pat. No. 7,524,614 (Tao et al.). Such advanced initiator compositions allow high speed imaging due to reduced energy requirement even without an oxygen barrier layer (protective overcoat) that is typically applied over an imageable layer that relies on imagewise hardening via free radical polymerization. For on-press development applications, the presence of an oxygen barrier layer is undesirable as it inhibits printing inks from attaching to the imageable layer in the laser exposed area and increases the number of printing sheets before such sheets become sellable. The primary components in the oxygen barrier layer are typically soluble in fountain solutions used in printing operation. Accumulation of such materials change the composition of fountain solutions and may break the ink-water balance during normal printing operation, leading to printing failures such as image "blinding" (inks failing to attached to the imaged areas) or "scumming" (inks attached to the non-printing surface of the printing plate), or both.

One of the disadvantages of using such advanced initiator compositions such as iodonium-borate compositions is that such compositions tend to crystallize on the surface of the imageable layer, a phenomenon common known as "blooming" in the art. Blooming is particularly severe when particulate primary binders are used, as the initiator composition can only be located between the primary binder particles and have higher local concentration than in situations where the primary binders are in non-particulate form. Blooming occurs more readily when the surface of the imageable layer is touched by various face rollers used in the printing plate precursor manufacturing. Thus, in order to minimize blooming, the average dry thickness of the imageable is typically kept low relative to the roughness of the underlying substrates. However, low average dry thickness often leads to low printing durability. As a result, on-press developable printing plate precursors have been limited to short to medium run length printing applications. Thus, in order to expand the applicability of on-press developable printing plate precursors, there is a need to further improve the printing durability while maintaining other essential properties such as fast imaging speed, fast on-press development, minimal contamination to the fountain solution, and good thermal stability during storage of the printing plate precursor.

SUMMARY OF THE INVENTION

The present invention provides a negative-working, infrared radiation-sensitive lithographic printing plate precursor comprising:

a substrate having a hydrophilic surface, and an infrared radiation-sensitive imageable layer that is disposed over the hydrophilic surface of the substrate, and that comprises:

a free radically polymerizable compound;

an initiator composition that provides free radicals upon exposure to infrared radiation;

an infrared radiation absorber;

a primary polymeric binder comprising polyalkylene oxide segments and is present in the form of particles having an average particle size ($D_1$) of at least 50 nm and up to and including 1000 nm; and a secondary resin that is present as particles having an average particle size ($D_2$) of at least 3 µm and up to and including 10 µm, wherein:

the infrared radiation-sensitive imageable layer has an average dry thickness (t) of at least 1 µm and up to and including 4 µM and satisfies the following Equation (1):

$$D_2/1.4 > t > D_1 \quad (1)$$

and the average dry thickness (t) is defined by the following Equation (2):

$$t = w/r \quad (2)$$

wherein w is the dry coverage of the infrared radiation-sensitive imageable layer in g/m² and r is 1 g/cm³.

In some embodiments, the infrared radiation-sensitive imageable layer used in this invention further satisfies the following Equation (3):

$$D_2/2 > t > D_1.$$

In yet other embodiments, the infrared radiation-sensitive imageable layer used in this invention further satisfies the following Equation (Iv):

$$D_2/2 > t > 2D_1.$$

This invention also provides a method for providing a lithographic printing plate, the method comprising:

imagewise exposing the negative-working, infrared radiation-sensitive lithographic printing plate precursor of any of the embodiments described herein to infrared radiation to provide exposed regions and non-exposed regions in the infrared radiation-sensitive imageable layer, and removing the non-exposed regions in the infrared radiation-sensitive imageable layer from the substrate on-press using a fountain solution, lithographic printing ink, or both fountain solution and lithographic printing ink, to provide a lithographic printing plate.

The negative-working, infrared radiation-sensitive lithographic printing plate precursors of the present invention are capable of providing lithographic printing plates having significantly improved printing durability while maintaining other essential properties such as fast imaging speed, fast on-press development, minimal contamination to the fountain solution, and good thermal stability during storage of the precursors.

DETAILED DESCRIPTION OF THE INVENTION

The following discussion is directed to various embodiments of the present invention and while some embodiments can be desirable for specific uses, the disclosed embodiments should not be interpreted or otherwise considered be limit the scope of the present invention, as claimed below. In addition, one skilled in the art will understand that the following disclosure has broader application than is explicitly described and the discussion of any embodiment.

DEFINITIONS

As used herein to define various components of the infrared radiation-sensitive imageable layer and processing solutions, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "negative-working, infrared radiation-sensitive lithographic printing plate precursor," "precursor," and "lithographic printing plate precursor" are meant to be equivalent references to embodiments of the present invention.

As used herein, the term "infrared radiation absorber" refers to compounds or materials that are sensitive to wavelengths of infrared radiation as defined below.

As used herein, the term "infrared" refers to radiation having a $\lambda_{max}$ of at least 750 nm and higher. In most instances, the term "infrared" is used to refer to the "near-infrared" region of the electromagnetic spectrum that is defined herein to be at least 750 nm and up to and including 1400 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers. These definitions apply to both the primary polymeric binders and secondary resins used in the present invention.

The term "copolymer" refers to polymers composed of two or more different repeating or recurring units that are arranged randomly or otherwise along the polymer backbone.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers, which backbone can have polyalkylene oxide segments in pendant groups.

The term "arranged randomly" means that blocks of recurring units are not intentionally incorporated into the polymeric binders, but that recurring units are incorporated into the backbone in a random fashion using known polymerization procedures that do not encourage the formation of block copolymers.

Recurring units in polymeric binders described herein are generally derived from the corresponding ethylenically unsaturated polymerizable monomers used in a polymerization process, which ethylenically unsaturated polymerizable monomers can be obtained from various commercial sources or prepared using known chemical synthetic methods.

As used herein, the term "ethylenically unsaturated polymerizable monomer" refers to a compound comprising one or more ethylenic ally unsaturated (—C═C—) bonds that are polymerizable using free radical or acid-catalyzed polymerization reactions and conditions. It is not meant to refer to chemical compounds that have only unsaturated —C═C— bonds that are not polymerizable under these conditions.

Unless otherwise indicated, the term "weight %" refers to the amount of a component or material based on the total solids of a composition, formulation, or layer. Unless otherwise indicated, the percentages can be the same for either a dry layer or the total solids of the formulation or composition.

As used herein, the term "layer" or "coating" can consist of one disposed or applied layer or a combination of several sequentially disposed or applied layers. The layer is considered infrared radiation-sensitive and negative-working it is both sensitive to infrared radiation as described above and negative-working in the formation of lithographic printing plates.

Uses

The present invention is useful for preparing lithographic printing plates by imagewise exposing and on-press processing (development) the inventive negative-working, infrared radiation-sensitive lithographic printing plate precursor.

Lithographic Printing Plate Precursor

The precursors of the present invention have only two essential structural components, that is a substrate and an infrared radiation-sensitive imageable layer, both of which have features that are defined below. An outermost hydrophilic overcoat (or oxygen barrier layer), as described below, is not essential but can be present in some embodiments.

Substrate:

The substrate that is present in the precursors of the present invention generally has a hydrophilic surface on its imaging side (as opposing to backside), or at least a surface that is more hydrophilic than the applied infrared radiation-sensitive imageable layer on the imaging side of the substrate. The substrate comprises a support that can be composed of any material that is conventionally used to prepare lithographic printing plate precursors. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

A useful substrate is composed of an aluminum support that can be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of at least 1.5 $g/m^2$ and up to and including 5 $g/m^2$ and more typically at least 3 $g/m^2$ and up to and including 4.3 $g/m^2$. Phosphoric acid anodization generally provides an oxide weight on the surface of from at least 1.5 $g/m^2$ and up to and including 5 $g/m^2$ and more typically at least 1 $g/m^2$ and up to and including 3 $g/m^2$.

An interlayer can be formed by treatment of the aluminum support with, for example, a silicate, dextrin, calcium zirconium fluoride, hexafluorosilicic acid, poly(vinyl phosphonic acid) (PVPA), vinyl phosphonic acid copolymer, poly[(meth) acrylic acid], acrylic acid copolymer or partially neutralized acrylic acid co-polymer to increase hydrophilicity. Still further, the aluminum support can be treated with a phosphate solution that can further contain an inorganic fluoride (PF). The aluminum support can be electrochemically-grained, sulfuric acid-anodized, and treated with PVPA or PF using known procedures to improve surface hydrophilicity.

A substrate can also comprise a grained and sulfuric acid anodized aluminum-containing support that has also been treated with an alkaline or acidic pore-widening solution to provide its outer surface with columnar pores so that the diameter of the columnar pores at their outermost surface is at least 90% of the average diameter of the columnar pores. This substrate further comprises a hydrophilic layer disposed directly on the grained, sulfuric acid anodized and treated aluminum-containing support, and the hydrophilic layer comprises a non-crosslinked hydrophilic polymer having carboxylic acid side chains. Further details of such substrates and methods for providing them are provided in U.S. Application Publication 2013/0052582 (Hayashi) the disclosure of which is incorporated herein with respect to substrates.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate can be coated with antistatic agents, a slipping layer, or a matte layer to improve handling and "feel" of the imageable element.

Infrared Radiation-Sensitive Imageable Layer:

The precursors of the present invention can be formed by suitable application of a negative-working infrared radiation-sensitive composition as described below to a suitable substrate (as described above) to form an infrared radiation-sensitive imageable layer that is negative-working on that substrate. In general, the infrared radiation-sensitive composition (and resulting infrared radiation-sensitive imageable layer) comprises, as essential components: one or more free radically polymerizable components; one or more infrared radiation absorbers; an initiator composition that provides free radicals upon exposure to imaging infrared radiation; one or more primary polymeric binders; and one or more secondary resins, all of which essential components are described below. There is generally only a single infrared radiation-sensitive imageable layer in the precursor. It can be the outermost layer in the precursor, but in some embodiments, there is an outermost water-soluble hydrophilic overcoat layer (described below) disposed over the one or more negative-working infrared-radiation imageable layers.

Many general details of negative-working infrared radiation-sensitive lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), U.S. Pat. No. 4,511,645 (Koike et al.), U.S. Pat. No. 6,027,857 (Teng), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Strehmel et al.), U.S. Pat. No. 6,232,038 (Takasaki), U.S. Pat. No. 6,627,380 (Saito et al.), U.S. Pat. No. 6,514,657 (Sakurai et al.), U.S. Pat. No. 6,808,857 (Miyamoto et al.), and U.S. Pat. No. 7,672,241 (Munnelly et al.), and U.S. Application Publications 2003/0064318 (Huang et al.), 2004/0265736 (Aoshima et al.), 2005/0266349 (Van Damme et al.), 2006/0019200 (Vermeersch et al.), and 2009/0092923 (Hayashi). While these publications describe many useful details of various components of the precursors, they do not describe the unique combination of primary polymeric binder, secondary resin, and average dry thickness features that are essential to the practice of the present invention.

The infrared radiation-sensitive compositions and infrared radiation-sensitive imageable layers used in the precursors include one or more primary polymeric binders, each of which comprises polyalkylenes oxide segments, and optionally pendant cyano groups as well. Such primary polymeric binders are present in the form of discrete particles (generally non-agglomerated particles) at room temperate and have an average particle size ($D_1$) of at least 50 nm and up to and including 1000 nm, or typically a $D_1$ of at least 100 nm and up to and including 750 nm. The primary polymeric binder particles are generally distributed uniformly within the infrared radiation-sensitive imageable layer. Average particle size can be determined by various known methods including measuring the particles in electron microscope images of the infrared radiation-sensitive imageable layer, and averaging a set number of such measurements.

In general, the primary polymeric binder is present in the form of particles having an average particle size ($D_1$) that is less than the dry thickness (t) of the infrared radiation-sensitive imageable layer, which average dry thickness (t) can be at least 1 µm and up to and including 4 µm, or typically at least 1 µm and up to and including 3 µm. In addition, the average dry thickness is defined by the following Equation (1) wherein $D_2$ is defined below:

$$D_2/1.4 > t > D_1.$$

The average dry thickness (t) of the infrared radiation-sensitive imageable layer is defined by the following Equation (2):

$$t = w/r$$

wherein w is the dry coverage of the infrared radiation-sensitive imageable layer provided from an infrared radiation-sensitive imageable layer formulation described below, after appropriate drying, as measured in g/m², and r is 1 g/cm³.

The primary polymeric binders generally have a number average molecular weight ($M_n$) of at least 2,000 and typically at least 20,000 and up to and including 1,000,000, or of at least 30,000 and up to and including 500,000, as determined by Gel Permeation Chromatography.

Useful particulate primary polymeric binders generally include polymeric emulsions or dispersions of polymers having hydrophobic backbones to which are directly or indirectly linked pendant poly(alkylene oxide) side chains (for example at least 10 alkylene glycol units), optionally cyano or phenyl side groups, or both types of side chains or side groups, that are described for example in U.S. Pat. No. 6,582,882 (Pappas et al.), U.S. Pat. No. 6,899,994 (Huang et al.), U.S. Pat. No. 7,005,234 (Hoshi et al.), and U.S. Pat. No. 7,368,215 (Munnelly et al.), and US Application Publication 2005/0003285 (Hayashi et al.), the disclosures of all of which are incorporated herein by reference with respect to these polymeric binders. More specifically, such primary polymeric binders include but are not limited to, graft copolymers having both hydrophobic and hydrophilic segments, block and graft copolymers having polyethylene oxide (PEO) segments, polymers having both pendant poly(alkylene oxide) segments and pendant cyano groups, in recurring units arranged in random fashion to form the polymer backbone, and various hydrophilic polymeric binders that additionally can have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

The particulate primary polymeric binders also can have a backbone comprising multiple (at least two) urethane moieties as well as pendant groups comprising the polyalkylenes oxide segments.

In some embodiments of the infrared radiation-sensitive lithographic printing plate precursor of this invention, the primary polymeric binder comprises recurring units comprising both polyalkylenes oxide segments and recurring units comprising pendant cyano groups.

The total primary polymeric binders are present in the infrared radiation-sensitive imageable layer in an amount of at least 25 weight % and up to and including 70 weight %, or more likely in an amount of at least 30 weight % and up to and including 50 weight %, based on the total dry weight (solids) of the infrared radiation-sensitive imageable layer.

The amount of primary polymeric binders per unit area of the infrared radiation-sensitive imageable layer is at least 250 mg/m² and up to and including 2450 mg/m², or more likely at least 300 mg/m² and up to and including 1750 mg/m².

The infrared radiation-sensitive imageable layer further comprises one or more secondary resins that can be composed of one or more crosslinked polymers if desired. The secondary resin is generally present in the infrared radiation-sensitive imageable layer in an amount of at least 1 weight % and up to and including 15 weight %, or typically in an amount of at least 1 weight % and up to and including 12 weight %, based on the total dry weight (solids) of the infrared radiation-sensitive imageable layer.

The amount of secondary resins per unit area of the infrared radiation-sensitive imageable layer is at least 10 mg/m² and up to and including 525 mg/m², or more likely at least 10 mg/m² and up to and including 420 mg/m².

Such secondary resins are generally in particulate form and the particles generally have an average particle size ($D_2$) of at least 3 µm and up to and including 10 µm, or more likely of at least 3 µm and up to and including 8 µm.

While a variety of polymeric materials can be used as the secondary resin, or used as mixtures of secondary resins, as long as the average particle size ($D_2$) feature described above is met.

Particularly useful secondary resins are in the form of particles that are composed of recurring units derived from one or more ethylenically unsaturated polymerizable monomers selected from the group consisting of an alkyl acrylate, alkyl methacrylate, and a styrene monomer. It is also useful in some embodiments, for the secondary resins also to be formed from ethylenically unsaturated polymerizable monomers having crosslinking groups such as multiple ethylenically unsaturated polymerizable groups, for example divinyl benzene, allyl acrylate, allyl methacrylate, diacrylates, dimethacrylates, triacrylates, and trimethacrylates.

For example, useful alkyl acrylates and alkyl methacrylates useful for preparing these secondary resins include but are not limited to, styrene, 3-methyl styrene, 4-methyl styrene, 4-methoxy styrene, 4-acetoxy styrene, α-methyl styrene, acrylic acid, methyl acrylate, ethyl acrylate, butyl acrylate, n-hexyl acrylate, methacrylic acid, methyl methacrylate, ethyl methacrylate, n-propyl methacrylate, n-butyl methacrylate, n-pentyl methacrylate, neo-pentyl methacrylate, cyclohexyl methacrylate, n-hexyl methacrylate, 2-ethoxyethyl methacrylate, 3-methoxypropyl methacrylate, allyl methacrylate, vinyl acetate, vinyl butyrate, methyl vinyl ketone, butyl vinyl ketone, vinyl fluoride, vinyl chloride, vinyl bromide, maleic anhydride, maleimide, N-phenyl maleimide, N-cyclohexyl maleimide, N-benzyl maleimide, and mixtures thereof.

Besides the primary polymeric binders and the secondary resins described above, the infrared radiation-sensitive imageable layer can further comprise up to 20 weight %, based on the total dry layer weight, of one or more additional polymeric binders that are defined as follows.

Useful additional polymeric binders include but are not limited to, particulate polyurethane-acrylic) hybrids that are distributed (usually uniformly) throughout the imageable layer. Each of these hybrids has a number average molecular weight ($M_n$) of at least 50,000 and up to and including 500,000 and the particles have an average particle size of at least 10 nm and up to and including 10,000 nm (typically at least 30 nm and up to and including 500 nm or at least 30 nm and up to and including 150 nm). These hybrids can be either "aromatic" or "aliphatic" in nature depending upon the specific reactants used in their manufacture. Blends of particles of two or more polyurethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the polyurethane-acrylic) hybrid particles in a suitable aqueous medium that can also include commercial surfactants, anti-foaming agents, dispersing agents, anti-corrosive agents, and optionally pigments and water-miscible organic solvents.

Still other useful additional polymeric binders can be homogenous, that is, film-forming, non-particulate, or dissolvable in the coating solvent. Such additional polymeric binders include but are not limited to, (meth)acrylic acid, (meth)acrylic alkyl ester, (meth)acrylic aryl ester, polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), U.S. Pat. No. 8,119,331 (Baumann et al.), and U.S. Pat. No. 6,893,797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.). Useful are random copolymers derived from polyethylene glycol(methyl ether) methacrylate/-acrylonitrile/styrene monomers in random fashion and in particulate form, dissolved random copolymers derived from carboxyphenyl methacrylamide/-acrylonitrile/methacrylamide/N-phenyl maleimide, random copolymers derived from polyethylene glycol methacrylate/acrylonitrile/vinyl carbazole/styrene/-methacrylic acid, random copolymers derived from N-phenyl maleimide/-methacrylamide/methacrylic acid, random copolymers derived from urethane-acrylic intermediate A (the reaction product of p-toluene sulfonyl isocyanate and hydroxyl ethyl methacrylate)/acrylonitrile/N-phenyl maleimide, and random copolymers derived from N-methoxymethyl methacrylamide/-methacrylic acid/acrylonitrile/n-phenylmaleimide.

Film-forming polymers having pendant allyl ester groups as described in U.S. Pat. No. 7,332,253 (Tao et al.). Such polymers can also include pendant cyano groups or have recurring units derived from a variety of other monomers as described in Col. 8, line 31 to Col. 10, line 3 of the noted patent.

Film-forming polymers having all carbon backbones wherein at least 40 mol % and up to and including 100 mol % (and typically at least 40 and up to and including 50 mol %) of the carbon atoms forming the all carbon backbones are tertiary carbon atoms, and the remaining carbon atoms in the all carbon backbone being non-tertiary carbon atoms. Such polymeric binders are described in more detail in U.S. Application Publication 2008-0280229 (Tao et al.).

Film-forming polymers that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group that is not particularly limited. The reactive vinyl groups can be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S.

Pat. No. 6,569,603 (Furukawa et al.). Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.).

Film-forming polymers that have pendant 1H-tetrazole groups as described in U.S. Application Publication 2009-0142695 (Baumann et al.).

The infrared radiation-sensitive composition (and infrared radiation-sensitive imageable layer) comprises one or more free radically polymerizable compounds, each of which contains one or more free radically polymerizable groups (and two or more of such groups in some embodiments) that can be polymerized using free radical initiation. In some embodiments, the infrared radiation-sensitive imageable layer comprises two or more free radically polymerizable compounds having different numbers of free radically polymerizable groups in each molecule.

For example, such free radically polymerizable compounds can contain one or more free radical polymerizable monomers or oligomers having one or more addition polymerizable ethylenically unsaturated groups (for example, two or more of such groups), crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable compound comprises carboxyl groups, hydroxyl groups, sulfonate groups, polyalkylene oxide groups in side chains.

Useful free radically polymerizable compounds include urea urethane (meth)acrylates or urethane (meth)acrylates having multiple (two or more) polymerizable groups. Mixtures of such compounds can be used, each compound having two or more unsaturated polymerizable groups, and some of the compounds having three, four, or more unsaturated polymerizable groups. For example, a free radically polymerizable compound can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds also include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), Sartomer 415 [ethoxylated (20)trimethylolpropane triacrylate], Sartomer CN968, Sartomer CN975, Sartomer CN989, Sartomer CN9001, Sartomer CN9010, Sartomer CN9025, Sartomer CN9029, Sartomer CN9165 and Sartomer CN2260 (all available from Sartomer Company, Inc.); NK OLIGO U-4HA, U-4H, U-6HA, U-15HA, U-108A, U-1084A, U-200AX, U-122A, U-340A, U-324A, UA-53H, and UA-100 (all manufactured by Shin-Nakamura Chemical Co., Ltd.); UA-306H, AI-600, UA-101T, UA-101I, UA-306T, and UA-306I (all manufactured by Kyoeisha Oil and Fats Chemical hid. Co., Ltd.); ART RESIN UN-9200A, UN-3320HA, UN-3320HB, UN-3320HC, UN-3320HS, SH-380G, SH-500, SH-9832, UN-901T, UN-904, UN-905, UN-906, UN-906S, UN-907, UN-952, UN-953, UN-954, H-91, and H-135 (all manufactured by Negami Chemical Industrial Co., Ltd.).

Other free radically polymerizable compounds are known in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, N.Y., 1989, pp. 226-262. Useful free radically polymerizable compounds are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.). Other useful free radically polymerizable compounds include those described in U.S. Application Publication 2009/0142695 (Baumann et al.), which free radically polymerizable compounds include 1H-tetrazole groups.

The one or more free radically polymerizable compounds are generally present in an infrared radiation-sensitive imageable composition (and resulting infrared radiation-sensitive imageable layer) in an amount of at least 10 weight % and up to and including 70 weight %, or typically at least 20 weight % and up to and including 65 weight %, based on the total solids in the noted composition or layer.

The infrared radiation-sensitive composition (and infrared radiation-sensitive imageable layer) also includes an initiator composition that includes one or more compounds that are capable of generating free radicals sufficient to initiate polymerization of the various free radically polymerizable compounds upon exposure to imaging infrared radiation. The initiator composition is generally responsive, for example, to electromagnetic radiation of at least 750 nm and up to and including 1400 nm or at least 750 nm and up to and including 1250 nm. The initiator composition can be designed for any of the noted infrared radiation exposures or for multiple infrared radiation exposures.

Useful initiator compositions can comprise onium compounds (salts) including ammonium, sulfonium, iodonium, diazonium, and phosphonium compounds, particularly in combination with infrared radiation-sensitive cyanine dyes (described below). Useful iodonium cations are well known in the art including but not limited to, U.S. Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged counterion.

Iodonium cations can be supplied as part of one or more iodonium salts and the iodonium cations can be supplied as iodonium borates also containing suitable boron-containing anions particularly in combination with infrared radiation-sensitive cyanine dyes. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.), the disclosure of which is incorporated herein by reference.

Useful infrared radiation-sensitive initiator compositions can comprise one or more iodonium compounds comprising borate anions such as a tetraaryl borate anion. Representative iodonium borate compounds of this type can comprise an iodonium cation and a tetraphenyl borate anion, and can include but are not limited to, 4-octyloxy-phenyl phenyliodonium tetraphenylborate, [4-[(2-hydroxytetradecyl)-oxy]phenyl]phenyliodonium tetraphenylborate, bis(4-t-butylphenyl)

iodonium tetraphenylborate, 4-methylphenyl-4'-hexylphenyliodonium tetraphenylborate, 4-methylphenyl-4% cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexyl-phenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl) phenyl]borate, 4-methoxyphenyl-4'-cyclohexyl-phenyliodonium tetrakis(penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds also include bis(4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition. U.S. Pat. No. 8,043,787 (Hauck et al.) the disclosure of which is incorporated herein by reference with respect to useful initiator compositions also describes diaryliodonium initiator compositions containing boron-containing anions.

In some embodiments, the initiator composition that is capable of generating free radicals upon exposure to imaging infrared radiation comprises a diaryliodonium cation and a boron-containing anion (such as a borate anion), wherein the diaryliodonium cation is represented by the following Structure (IV):

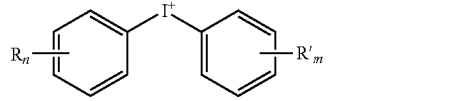

(IV)

wherein R and R' independently represent halogen, nitro, alkyl, aryl, cycloalkyl, alkoxy, aryloxy, alkenyl, alkynyl, alkylamino, dialkylimino, alkylamido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5. The sum of m and n can be 1 to 6. The boron-containing anion can be represented by the following Structure:

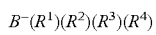

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms. In some embodiments, all of the $R^1$, $R^2$, $R^3$, and $R^4$ are the same or different substituted or unsubstituted aryl groups such as substituted or unsubstituted phenyl groups, or more likely all of these groups are unsubstituted phenyl groups, and the sum of m and n can be 1 to 6.

The amount of the initiator composition in the infrared radiation-sensitive imageable layer would be readily apparent to one skilled in the art and would be dependent upon the particular components included therein. For example, the initiator composition can be present in an amount of at least 0.1 weight % and up to and including 25 weight %, or typically at least 0.5 weight % and up to and including 15 weight %, based on the total solids in the infrared radiation-sensitive composition (or corresponding infrared radiation-sensitive imageable layer).

As noted above, the infrared radiation-sensitive composition (and imageable layer) also comprises one or more infrared radiation absorbers to provide desired radiation sensitivity. The total amount of one or more infrared radiation absorbers is at least 0.5 weight % and up to and including 30 weight %, or typically at least 1 weight % and up to and including 15 weight %, based on the total solids of the infrared radiation-sensitive composition (or imageable layer).

Some useful infrared radiation absorbers are sensitive to both infrared radiation (typically of at least 750 nm and up to and including 1400 nm) and visible radiation (typically of at least 450 nm and up to and including 700 nm). These compounds also have a tetraaryl pentadiene chromophore. Such chromophore generally includes a pentadiene linking group having 5 carbon atoms in the chain, to which are attached two substituted or unsubstituted aryl groups at each end of the linking group. These aryl groups can be substituted with the same or different tertiary amine groups. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain. Other details of such compounds are provided in U.S. Pat. No. 7,429,445 (Munnelly et al.).

In many embodiments of this invention, the present invention comprises one or more infrared radiation absorbers that are sensitive only to near-infrared or infrared radiation having a wavelength of at least 750 nm. Such useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyrylo-arylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), and U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao) the disclosure of which is incorporated herein by reference. A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfa, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et at). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Useful infrared radiation-sensitive compositions with infrared radiation absorbers are also described, for example, in U.S. Pat. No. 7,452,638 (Yu et al.), and U.S. Patent Publications 2008/0254387 (Yu et al.), 2008/0311520 (Yu et al.), 2009/0263746 (Ray at), 2010/0021844 (Yu et al.), 2013/0758573 (Balbinot et al.), and 2014/0045118 (Balbinot et al.).

Additional additives useful in the infrared radiation-sensitive imageable layer include dye precursors and color developers.

Useful dye precursors include phthalide and fluoran leuco dyes having a lactone skeleton with an acid dissociation property, such as those described in U.S. Pat. No. 6,858,374 (Yanaka) the disclosure of which is incorporated herein by reference. Specific examples of dye precursors include but are not limited to, Crystal Violet Lactone, Malachite Green Lactone, Benzoyl Leuco Methylene Blue, 3-(N,N-diethylamino)-6-chlor-o-7-(β-ethoxyethylamino)fluoran, 3-(N,N,N-triethylamino)-6-methyl-7-anilinofluoran, 3-(N,N-diethylamino)-7-chloro-7-o-chlorofluoran, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzo-fluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide. These compounds can be used individually or as mixtures.

Color developers are meant to include monomeric phenolic compounds, organic acids or metal salts thereof, oxybenzoic acid esters, acid clays, and other compounds described for example in U.S. Patent Publication 2005/0170282 (Inno et al.). The infrared radiation-sensitive imageable layer can also include a variety of other optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. The infrared radiation-sensitive imageable layer can also optionally include a phosphate (meth)acrylate having a molecular weight generally greater than 250 as described in U.S. Pat. No. 7,429,445 (Munnelly et al.) the disclosure of which is incorporated herein by reference.

Hydrophilic Overcoat:

The negative-working infrared radiation-sensitive lithographic printing plate precursor optionally can have an outermost hydrophilic overcoat (or oxygen-barrier layer) disposed directly on the negative-working radiation-sensitive imageable layer (no intermediate layers between these two layers). When present, this hydrophilic overcoat is generally the outermost layer of the precursor and thus, when stacked with other precursors, the outermost hydrophilic overcoat of one precursor would be in contact with the backside of the substrate of the precursor immediately above it.

Such hydrophilic overcoats can comprise one or more film-forming water-soluble polymeric binders in an amount of at least 60 weight % and up to and including 98 weight %, based on the total dry weight of the hydrophilic overcoat.

Such film-forming water-soluble (or hydrophilic) polymeric binders can include a modified or unmodified poly (vinyl alcohol) having a saponification degree of at least 30%, or a degree of at least 75%, or a degree of at least 90%, and a degree of up to and including 99.9%.

For example, the hydrophilic overcoat can include one or more film-forming water-soluble polymeric binders that comprise at least one modified poly(vinyl alcohol) that is modified with at least 0.1 mol % of one or more of the same or different groups selected from the group consisting of acetoacetyl, alkylene, silanol, amino, thioalkyl, glycol, and glycol groups.

Further, one or more acid-modified poly(vinyl alcohol)s can be used as film-forming water-soluble (or hydrophilic) polymeric binders in the hydrophilic overcoat. For example, at least one modified poly(vinyl alcohol) can be modified with an acid group selected from the group consisting of carboxylic acid, sulfonic acid, sulfuric acid ester, phosphonic acid, and phosphoric acid ester groups. Examples of such materials include but are not limited to, sulfonic acid-modified poly (vinyl alcohol), carboxylic acid-modified poly(vinyl alcohol), and quaternary ammonium salt-modified poly(vinyl alcohol), glycol-modified poly(vinyl alcohol), or combinations thereof. Specific commercial examples of the acid-modified poly(vinyl alcohol) include SD 1000 that is available from Kuraray, and Gohsefimer K-210, Gohseran L-3266, Nichigo G-Polymer AZF8035, and Gohseran CKS-50 that are available from Nippon Gohsei.

The hydrophilic overcoat can further comprise one or more other film-forming water-soluble polymers that are not poly (vinyl alcohol)s for example in an amount of at least 2 weight % and up to and including 40 weight %, of a poly(vinyl pyrrolidone), poly(ethyleneimine), poly(vinyl imidazole), poly(vinyl caprolactone), or a random copolymer derived from two or more of vinyl pyrrolidone, ethyleneimine, vinyl caprolactone, vinyl acetate, and vinyl imidazole, and vinyl acetamide.

The hydrophilic overcoat formulations can also include cationic, anionic, amphoteric, or non-ionic wetting agents or surfactants, flow improvers or thickeners, antifoamants, colorants, and biocides. Details about such addenda and useful amounts are provided in WO 99/06890 (Pappas et al.), EP 1,788,429 (Loccufier et al.), and U.S. Application Publications 2005/0266349 (Van Damme et al.), 2007/0231739 (Koizumi), 2007/0231740 (Yanaka et al.), and 2011/0053085 (Huang et al.).

The hydrophilic overcoat can be generally present at a dry coating coverage of at least 0.1 g/m$^2$ and up to but less than 4 g/m$^2$, or typically at a dry coating coverage of at least 0.15 g/m$^2$ and up to and including 2.5 g/m$^2$. In some embodiments, the dry coating coverage is at least 0.1 g/m$^2$ and up to and including 1.5 g/m$^2$ or at least 0.1 g/m$^2$ and up to and including 0.9 g/m$^2$, such that the hydrophilic overcoat layer is relatively thin for easier removal during on-press development.

The hydrophilic overcoat can optionally comprise organic wax particles dispersed, generally uniformly, within the one or more film-forming water-soluble (or hydrophilic) polymeric binders as described for example in U.S. Application Publication 2013/0323643 (Balbinot et al.) the disclosure of which is incorporated herein by reference. These organic wax particles can be present in an amount of at least 0.05 weight % and up to and including 20 weight %, or in an amount of at least 0.5 weight % and up to and including 10 weight %, all based on the total dry hydrophilic overcoat weight. Useful organic wax particles can be prepared using known procedures as described for example, in WO96/010599 (Soler Codina). Some useful fluorinated and non-fluorinated hydrocarbon wax particles can also be purchased from a number of commercial sources such as Mitsui Chemical Inc. or Münzing Liquid Technologies GmbH.

Preparing Lithographic Printing Plate Precursors

The negative-working infrared radiation-sensitive compositions described above can be applied to a substrate as a solution or dispersion in a coating liquid using any suitable equipment and procedure, such as spin coating, knife coating, gravure coating, die coating, slot coating, bar coating, wire rod coating, roller coating, or extrusion hopper coating. They can also be applied by spraying onto a suitable support. Typically, the negative-working infrared radiation-sensitive composition is applied and dried to form a negative-working infrared radiation-sensitive imageable layer.

To achieve the desired advantages, the applied coverage is designed so that the dried infrared radiation-sensitive imageable layer has an average dry thickness (t) of at least 1 μm and up to and including 4 μm, or typically of at least 1 μm and up to and including 3 μm, and satisfies the following Equation (1) as described above:

$$D_2/1.4 > t > D_1 \quad (1)$$

and the average dry thickness (t) is defined by the following Equation (2):

$$t = w/r \quad (2)$$

wherein w is the dry coverage of the infrared radiation-sensitive imageable layer in g/m$^2$ and r is 1 g/cm$^3$.

In Equation (1), the terms $D_1$ and $D_2$ are defined above in relation to the primary polymeric binder and secondary resin, respectively.

In some embodiments of this invention, the negative-working, infrared radiation-sensitive lithographic printing plate precursor is further defined wherein the infrared radiation-sensitive imageable layer further satisfies the following Equation (3):

$$D_2/2 > t > D_1.$$

In such embodiments, both Equations (1) and (3) are satisfied.

In still other embodiments of this invention, the negative-working, infrared radiation-sensitive lithographic printing plate precursor is defined wherein the infrared radiation-sensitive imageable layer satisfies both Equation (1) as well as the following Equation (IV):

$$D_2/2 > t > 2D_1.$$

The manufacturing methods used to prepare the precursor of this invention can include mixing the essential components and any optional components needed for the infrared radiation-sensitive imageable layer in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting composition to a substrate, and removing the solvent(s) by evaporation under suitable drying conditions. Some representative coating solvents and infrared radiation-sensitive imageable layer formulations are described in the Invention Examples below. After proper drying, the dry coating coverage of the negative-working imageable layer is defined as described above.

Distinct non-imageable layers can also be present under the infrared radiation-sensitive imageable layer and disposed directly on the hydrophilic substrate to enhance developability or to act as thermal insulating layers.

In some embodiments, a suitable aqueous-based hydrophilic overcoat formulation (as described above) can be applied to the dried infrared radiation-sensitive imageable layer in a suitable manner, and then dried as described below. In such instances, the dry coverage of the hydrophilic overcoat is generally as described above.

Once the various layers have been applied and dried on the substrate, the negative-working infrared radiation-sensitive lithographic printing plate precursors can be enclosed in water-impermeable material that substantially inhibits the transfer of moisture to and from the element and "heat conditioned" as described in U.S. Pat. No. 7,175,969 (noted above) the disclosure of which is incorporated herein by reference.

The lithographic printing plate precursors can be stored and transported as stacks of precursors within suitable packaging and containers known in the art, and interleaf papers can be present between the adjacent precursors in the stacks, or in some embodiments, such interleaf papers can be omitted.

Imaging (Exposing) Conditions

During use, a negative-working infrared radiation-sensitive lithographic printing plate precursor of this invention can be exposed to a suitable source of exposing radiation depending upon the infrared radiation absorber present in the infrared radiation-sensitive imageable layer to provide specific sensitivity that is at a wavelength of at least 750 nm and up to and including 1400 nm, or of at least 750 nm and up to and including 1250 nm using an appropriate energy source.

For example, imaging can be carried out using imaging or exposing radiation from an infrared radiation-generating laser (or array of such lasers). Imaging also can be carried out using imaging radiation at multiple wavelengths at the same time if desired. The laser used to expose the precursor is usually a diode laser, because of the reliability and low maintenance of diode laser systems, but other lasers such as gas or solid-state lasers can also be used. The combination of power, intensity and exposure time for infrared radiation laser imaging would be readily apparent to one skilled in the art.

The imaging apparatus can be configured as a flatbed recorder or as a drum recorder, with the negative-working infrared radiation-sensitive lithographic printing plate precursor mounted to the interior or exterior cylindrical surface of the drum. An example of useful imaging apparatus are available as models of KODAK® Trendsetter platesetters (Eastman Kodak Company) that contain laser diodes that emit near infrared radiation at a wavelength of about 830 nm. Other suitable imaging apparatus includes the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.) that operates at a wavelength of 810 nm.

Imaging with infrared radiation can be carried out generally at imaging energies of at least 30 mJ/cm$^2$ and up to and including 500 mJ/cm$^2$ and typically at least 50 mJ/cm$^2$ and up to and including 300 mJ/cm$^2$ depending upon the sensitivity of the infrared radiation-sensitive imageable layer.

While infrared radiation laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

On-Press Developing and Printing

Printing can be carried out by putting the exposed lithographic printing plate precursor on a suitable printing press. The exposed precursor is generally secured in the printing press using suitable clamps or other holding devices. Once the exposed precursor is secured in the printing press, printing can be carried out by applying a lithographic printing ink and fountain solution to the printing surface in a suitable manner forming an emulsion of the lithographic printing ink and fountain solution. Processing or development generally occurs during the first few impressions run on the printing press. In general, the fountain solution is taken up by the surface of the hydrophilic substrate revealed by the exposing and processing steps, and the lithographic ink is taken up by the remaining (exposed) regions of the imageable layer. The lithographic ink is then transferred to a suitable receiving material (such as cloth, paper, metal, glass, or plastic) to provide a desired impression of the image thereon. If desired, an intermediate "blanket" roller can be used to transfer the lithographic ink from the lithographic printing plate to the receiving material (for example, sheets of paper). The lithographic printing plates can be cleaned between impressions, if desired, using conventional cleaning means.

Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Yarn International, Addison, Ill.).

The present invention provides at least the following embodiments and combinations thereof, but other combinations of features are considered to be within the present invention as a skilled artisan would appreciate from the teaching of this disclosure:

1. A negative-working, infrared radiation-sensitive lithographic printing plate precursor comprising:
a substrate having a hydrophilic surface, and
an infrared radiation-sensitive imageable layer that is disposed over the hydrophilic surface of the substrate, and that comprises:
a free radically polymerizable compound;
an initiator composition that provides free radicals upon exposure to infrared radiation;
an infrared radiation absorber;
a primary polymeric binder comprising polyalkylene oxide segments and is present in the form of particles having an average particle size ($D_1$) of at least 50 nm and up to and including 1000 nm; and
a secondary resin that is present as particles having an average particle size ($D_2$) of at least 3 μm and up to and including 10 μm, wherein:
the infrared radiation-sensitive imageable layer has an average dry thickness (t) of at least 1 μM and up to and including 4 μm and satisfies the following Equation (1):

$$D_2/1.4 > t > D_1 \tag{1}$$

and the average dry thickness (t) is defined by the following Equation (2):

$$t = w/r \tag{2}$$

wherein w is the dry coverage of the infrared radiation-sensitive imageable layer in g/m$^2$ and r is 1 g/cm$^3$.

2. The negative-working, infrared radiation-sensitive lithographic printing plate precursor of embodiment 1, wherein the primary polymeric binder comprises recurring units comprising polyalkylene oxide segments and recurring units comprising pendant cyano groups.

3. The negative-working, infrared radiation-sensitive lithographic printing plate precursor of embodiment 1 or 2, wherein the infrared radiation-sensitive imageable layer further satisfies the following Equation (3):

$$D_2/2 > t > D_1.$$

4. The negative-working, infrared radiation-sensitive lithographic printing plate precursor of any of embodiments 1 to 3, wherein the infrared radiation-sensitive imageable layer further satisfies the following Equation (IV):

$$D_2/2 > t > 2D_1.$$

5. The negative-working, infrared radiation-sensitive lithographic printing plate precursor of any of embodiments 1 to 4, wherein the initiator composition comprises a compound comprising a tetraaryl borate anion.

6. The negative-working, infrared radiation-sensitive lithographic printing plate precursor of any of embodiments 1 to 5, wherein the initiator composition comprises an iodonium cation and a tetraphenyl borate anion.

7. The negative-working, infrared radiation-sensitive lithographic printing plate precursor of any of embodiments 1 to 6, wherein the secondary resin particles comprise a crosslinked polymer.

8. The negative-working, infrared radiation-sensitive lithographic printing plate precursor of embodiment 7, wherein the secondary resin particles are composed of recurring units derived from one or more ethylenically unsaturated polymerizable monomers selected from the group consisting of an alkyl acrylate, alkyl methacrylate, and a styrene monomer.

9. The negative-working, infrared radiation-sensitive lithographic printing plate precursor of any of embodiments 1 to 8, wherein the secondary resin particle is present in the infrared radiation-sensitive imageable layer in an amount of at least 1 weight % and up to and including 15 weight %, based on the total solids of the infrared radiation-sensitive imageable layer.

10. The negative-working, infrared radiation-sensitive lithographic printing plate precursor of any of embodiments 1 to 9, wherein the primary polymeric binder is present in the infrared radiation-sensitive imageable layer in an amount of at least 25 weight % and up to and including 70 weight %, based on the total solids of the infrared radiation-sensitive imageable layer.

11. A method for providing a lithographic printing plate, the method comprising:
imagewise exposing the negative-working, infrared radiation-sensitive lithographic printing plate precursor of any of embodiments 1 to 10 to infrared radiation to provide exposed regions and non-exposed regions in the infrared radiation-sensitive imageable layer, and removing the non-exposed regions in the infrared radiation-sensitive imageable layer from the substrate on-press using a fountain solution, lithographic printing ink, or both fountain solution and lithographic printing ink, to provide a lithographic printing plate.

The following Examples are provided to illustrate the practice of this invention and are not meant to be limiting in any manner.

INVENTION EXAMPLE 1

To prepare negative-working lithographic printing plate precursors, a substrate with a hydrophilic surface was prepared in the following manner. The surface of an aluminum sheet was subjected to an electrolytic roughening treatment using hydrochloric acid to provide an average roughness ($R_a$) of 0.5 µm. The, the roughened aluminum sheet was anodized using an aqueous phosphoric acid solution to form an aluminum oxide layer of 2.5 g/m². The aluminum sheet was then post-treated using a poly(acrylic acid) solution.

The infrared radiation-sensitive imageable layers were prepared using Formulation 1 shown in TABLE I below, which was applied onto the prepared aluminum substrate to provide a dry coverage of 1.5 g/m² using a bar coater, followed by drying at 110° C. for 40 seconds and further cooling to 35° C. Thus, a negative-working infrared radiation-sensitive lithographic printing plate precursor was obtained.

TABLE I

| Components | Amount |
| --- | --- |
| Particulate primary polymeric binder emulsion prepared from PEGMA[*1]/Acrylonitrile/Styrene = 10/70/20 as % weight (24% by mass solution in 1-Propanol/water = 76/24 weight % mix solvent, average particle size $D_1$ of 350 nm) | 6.95 g |
| KLUCEL ® E (Hydroxypropyl cellulose, Hercules Inc.) | 0.25 g |
| Urethane acrylate[*2] | 1.65 g |
| Sartomer SR399[*3] | 0.77 g |
| IRGACURE ® 250[*4] | 0.30 g |
| Infrared absorbing dye of the following Chemical Formula 1 | 0.15 g |
| 3-Mercapto-1,2,4-triazol[*5] | 0.05 g |
| BYK ® 336[*6] | 0.18 g |
| Particulate secondary resin (Techpolymer SSX-105[*7]) | 0.47 g |
| 1-Propanol | 39.80 g |
| Methyl ethyl ketone | 40.00 g |
| γ-Butyrolactone | 0.88 g |
| Water | 8.60 g |

[*1]Polyethylene glycol methyl ether methacrylate from Sigma-Aldrich.

[*2]2-Butanone solution with a concentration of 80% by mass of a polymerizable compound obtained by reacting DESMODUR ® N100 (aliphatic polyisocyanate resin including hexamethylene diacrylates available from Bayer) with hydroxyethyl acrylate and pentaerythritol triacrylate.

[*3]Trimethylol propanetetraacrylate (available from Sartomer Company).

[*4]Propylene carbonate solution with a concentration of 75% by mass of iodonium (4-methoxyphenyl[4-(2-methylpropyl)phenyl]hexafluorophosphate (available from Chiba Specialty Chemicals).

[*5]3-Mercapto-1,2,4-triazole (available from PCAS, France).

[*6]Xylene/methoxypropyl acetate solution with a concentration of 25% by mass of a modified dimethylpolysiloxane copolymer.

[*7]Techpolymer SSX-105: Crosslinked acrylic beads, average particle size ($D_2$) is 5.0 µm (Sekisui Plastics Co., Ltd.).

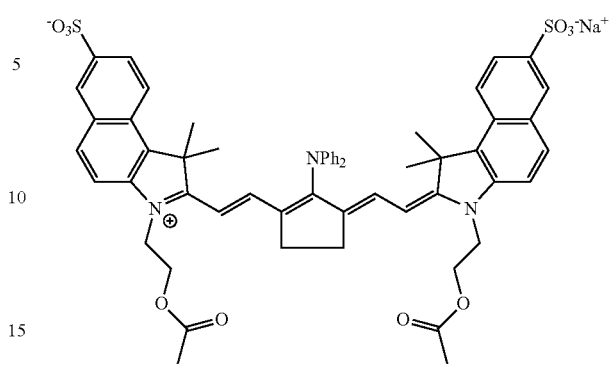

Chemical Formula 1

INVENTION EXAMPLES 2 TO 15

These inventive examples were prepared as described in Invention Example 1 except that the particulate secondary resins that are shown below in TABLE II were used in place of Techpolymer SSX-105 in the infrared radiation-sensitive imageable layer and the coating weights were changed as shown in TABLE II.

TABLE II

| | Particulate Secondary Resin | | |
| --- | --- | --- | --- |
| Invention Example | Brand name | Average Particle $D_2$ (µm) | Coating weight (g/m²) |
| 2 | Techpolymer SSX-105 | 5.0 | 1.0 |
| 3 | Techpolymer SSX-105 | 5.0 | 2.0 |
| 4 | Techpolymer SSX-108[8] | 8.0 | 1.5 |
| 5 | Techpolymer SSX-110[9] | 10.0 | 1.5 |
| 6 | Techpolymer SSX-110[9] | 10.0 | 2.5 |
| 7 | Techpolymer S SX-110[9] | 10.0 | 3.5 |
| 8 | CHEMISNOW ® MX-300[10] | 3.0 | 1.5 |
| 9 | CHEMISNOW ® MX-500[11] | 5.0 | 1.5 |
| 10 | CHEMISNOW ® MR-7GC[12] | 6.0 | 1.5 |
| 11 | TOSPEARL ® 2000B[13] | 6.0 | 1.5 |
| 12 | Ganzpearl GS-0605[14] | 6.5 | 1.5 |
| 13 | MIPELON ™ PM-200[15] | 10.0 | 1.5 |
| 14 | KTL-8FH[16] | 3.5 | 1.5 |
| 15 | Art-pearl C-800[17] | 6.0 | 1.5 |

[8,9]Techpolymer SSX-108, SSX-110: Crosslinked acrylic beads (Sekisui Plastics Co., Ltd.).
[10-12]CHEMISNOW ® MX-300, MX-500, MR-7GC: Crosslinked acrylic beads (Soken Chemical & Engineering Co., Ltd.).
[13]TOSPEARL ® 2000B: Silicone polymer (Momentive performance materials, Inc.).
[14]Ganzpearl GS-0605: Styrene/divinylbenzene copolymer (AICA Kogyo Co., Ltd.).
[15]MIPELON ™ PM-200: polyethylene powder (Mitsui Chemicals, Inc.).
[16]KTL-8FH: PTFE solid powder (Kitamura Limited).
[17]Art-pearl C-800: Crosslinked urethane beads (Negami Chemical Industrial Co., Ltd.).

INVENTION EXAMPLE 16

Another negative-working infrared radiation-sensitive lithographic printing plate precursor was prepared according to the present invention in the same manner as described in Invention Example 1, except that the polymeric emulsion[18] was used as the primary polymeric binder in place of the primary polymeric binder shown in TABLE I.

[18]Copolymer derived from PEGMA[1]/acrylonitrile/styrene (24% by weight solution, average particle size $D_1$ of 150 nm).

INVENTION EXAMPLE 17

Still another negative-working infrared radiation-sensitive lithographic printing plate precursor was prepared according to the present invention as described in Invention Example 16, except that the particulate secondary resin Micro-beads CHEMISNOW® MR-70C[12] was used in place of Techpolymer SSX-105.

INVENTION EXAMPLE 18

Another negative-working infrared radiation-sensitive lithographic printing plate precursor was prepared according to the present invention as described in Invention Example 1, except that Formulation 2 shown in below in TABLE III was used in place of Formulation 1.

TABLE III

| Components | Amount |
|---|---|
| Particulate primary polymeric binder emulsion prepared from PEGMA[*1]/Acrylonitrile/Styrene = 10/70/20 as % weight (24% by mass solution in 1-Propanol/water = 76/24 weight % mix solvent, average particle size $D_1$ of 550 nm) | 6.95 g |
| KLUCEL ® E (Hydroxypropyl cellulose, Hercules Inc.) | 0.26 g |
| Urethane acrylate[*2] | 1.70 g |
| Sartomer SR399[*3] | 0.70 g |
| IRGACURE ® 250[*4] | 0.25 g |
| Infrared absorbing dye of Chemical Formula 1 shown above | 0.14 g |
| 3-Mercapto-1,2,4-triazole[*5] | 0.04 g |
| BYK ® 336[*6] | 0.14 g |
| TEGO Dispers 650[*19] | 0.07 g |
| Particulate secondary resin (CHEMISNOW ® MX-500[*11]) | 0.46 g |
| 1-Propanol | 39.91 g |
| Methyl ethyl ketone | 40.00 g |
| γ-Butyrolactone | 0.88 g |
| Water | 8.50 g |

[19]TEGO Dispers 650: Oxirane, phenyl-, polymer with oxirane, monoalkyl ether (Evonik Industries).

INVENTION EXAMPLE 19

A negative-working infrared radiation-sensitive lithographic printing plate precursor as prepared according to the present invention as described in Invention Example 18 except that Formulation 2 was coated to provide a dry coverage of 3.5 g/m².

COMPARATIVE EXAMPLES 1 to 7

Lithographic printing plate precursors outside of the present invention were prepared similarly to that of Invention Example 1, except that the particulate secondary resins shown below in TABLE IV were used in place of Techpolymer SSX-105.

TABLE IV

| Comparative Example | Brand Name | Particulate Secondary Resin Average Particle Size $D_2$ (μm) | Coating Weight (g/m²) |
|---|---|---|---|
| 1 | Techpolymer SSX-115[20] | 15.0 | 1.5 |
| 2 | Techpolymer SSX-120[20] | 20.0 | 1.5 |
| 3 | CHEMISNOW ® MX-180TA[21] | 1.8 | 1.5 |
| 4 | Art-pearl MM-120TW[22] | 2.0 | 1.5 |
| 5 | SUPER-TITANIA F-1[23] | 0.75 | 1.5 |
| 6 | MEK-ST2040[24] | 0.20 | 1.5 |
| 7 | None | | 1.5 |

[20]Techpolymer SSX-115, SSX-120: Crosslinked acrylic beads (Sekisui Plastics Co., Ltd.).
[21]CHEMISNOW ® MX-180TA: Crosslinked acrylic beads (Soken Chemical & Engineering Co., Ltd.).
[22]Art-pearl MM-120TW: Crosslinked urethane beads (Negami Chemical Industrial CO., LTD.).
[23]SUPER-TITANIA F-1: Titanium dioxide nano particle (Showa Denko K. K.).
[24]MEK-ST2040: Colloidal silica particle (Nissan Chemical Industries, Ltd.).

COMPARATIVE EXAMPLE 8

Another lithographic printing plate precursor outside of the present invention was prepared similarly to that described in Invention Example 1 except that the non-particulate primary polymeric binder shown below in Formula 2 was used in place of the particulate primary polymeric binder emulsion PD240 in Invention Example 1.

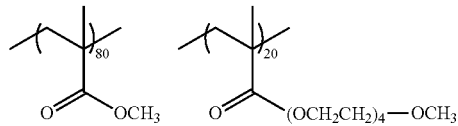

Formula 2

Primary Polymeric Binder (24% by weight solution)

COMPARATIVE EXAMPLE 9

Yet another lithographic printing plate precursor outside of the present invention was prepared similar to that described in Comparative Example 8 except that the Micro-beads Tospearl 2000B was used in place of Techpolymer SSX-105 as the particulate secondary resin.

Each prepared lithographic printing plate precursor was imaged using a Kodak Magnus 800 Platesetter. Evaluations of each precursor were carried out as follows.

Blooming:

Each of the lithographic printing plate precursors was scratched 3 times using an EPDM rubber sheet with 100 g weight, and then aged 7 days at 40° C. under 80% relative humidity conditions. After the aging process, the scratched areas of the lithographic printing plate precursors were observed using SEM. The blooming evaluation was determined from whether crystallization formed on the precursor surface or not in order to see the kind of thermal stability for each example.

Blocking:

Each of the lithographic printing plate precursors was packed with an interleaf paper, sandwiched with a dummy plate and cardboard and aged 7 days at 40° C. under 80% relative humidity condition under a 400 kg/m² weight. After this treatment, the blocking property was evaluated by measuring dE of the interleaf paper. The parameter (dE) was calculated from the L*a*b* values of a fresh interleaf paper (L1, a1, b1) and the L*a*b* values of the tested interleaf paper (L2, a2, b2) measured with a CR-310 Chroma Meter (Konica Minolta, Inc.) and using the formula:

$$[(L1-L2)^2+(a1-a2)^2+(b1-b2)^2]^{1/2}.$$

On-Press Developability (DOP):

Each of the lithographic printing plate precursors was imaged as noted above and mounted onto a Roland R-201 press machine for on-press development. A fountain solution [Presarto WS 100 marketed by DIC Graphics)/isopropyl alcohol/water=1/1/98 (volume ratio)] and lithographic printing ink (Fusion G Magenta N marketed by DIC Graphics) were supplied to the printing press, and printing was performed at a printing rate of 9,000 sheets/hour. On-press developability was evaluated by the number of printed paper sheets after which no ink transfer was observed in the non-imaging areas.

Printing Press Life:

Each of the lithographic printing plate precursors was exposed as described above and mounted onto a Komori S-26 press machine. A fountain solution [Presarto WS100 marketed by DIC Graphics)/isopropyl alcohoUwater=1/1/98 (volume ratio)] and lithographic printing ink (Fusion G Magenta N marketed by DIC Graphics) were supplied, and printing was performed at a printing rate of 9,000 sheets/hour. When the number of printed paper sheets increased from continued printing, the imaging infrared radiation-sensitive imageable layer was gradually worn away, and the ink receptivity thereof deteriorated. Thus, the ink concentration on the printed paper sheets was reduced. Printing press life was evaluated by the number of printed paper sheets at which the ink concentration (reflective concentration) thereon was reduced to 90% or less of the ink concentration when printing was started.

The evaluation results of the Blooming, Blocking, Printing Press Life, and DOP tests are shown below in TABLE V.

TABLE V

| Example | Blooming[25] (Crystals on surface) | Blocking[26] (Transfer to interleaf: dE) | Printing press-life[27] (×10,000 sheets) | On-press developability[28] (sheets) |
|---|---|---|---|---|
| Invention 1 | A | 0.35 | 25 | 3 |
| Invention 2 | A | 0.24 | 19 | 3 |
| Invention 3 | A | 0.43 | 29 | 3 |
| Invention 4 | A | 0.33 | 25 | 3 |
| Invention 5 | A | 0.37 | 24 | 3 |
| Invention 6 | A | 0.44 | 28 | 3 |
| Invention 7 | A | 0.78 | 33 | 4 |
| Invention 8 | A | 0.52 | 26 | 3 |
| Invention 9 | A | 0.30 | 26 | 3 |
| Invention 10 | A | 0.29 | 25 | 3 |
| Invention 11 | A | 0.49 | 25 | 3 |
| Invention 12 | A | 0.45 | 26 | 3 |
| Invention 13 | A | 0.88 | 24 | 4 |
| Invention 14 | A | 0.71 | 25 | 4 |
| Invention 15 | A | 0.67 | 25 | 4 |
| Invention 16 | A | 0.46 | 24 | 4 |
| Invention 17 | A | 0.41 | 24 | 4 |
| Invention 18 | A | 0.22 | 27 | 2 |
| Invention 19 | A | 0.77 | 35 | 2 |
| Comparative 1 | B | 2.43 | 11 | 35 |
| Comparative 2 | B | 2.31 | 8 | 50 |
| Comparative 3 | B | 2.85 | 18 | 5 |
| Comparative 4 | B | 2.94 | 16 | 10 |
| Comparative 5 | B | 3.12 | 20 | 5 |
| Comparative 6 | B | 2.77 | 17 | 6 |
| Comparative 7 | B | 3.76 | 17 | 4 |
| Comparative 8 | A | 2.17 | 10 | 150 |
| Comparative 9 | A | 2.53 | 9 | 200 |

[25](A): No formation of crystals; (B): Formation of crystals
[26]Blocking: the lower the dE, the better
[27]Printing press life: the more, the better
[28]On-press developability: the fewer, the better As the results in TABLE V show, the lithographic printing plate precursors of Invention Examples 1 to 19 exhibited high printing press life, good DOP, and reduced blocking, as compared with the lithographic printing plate precursors of Comparative Examples 1 to 9. In addition, the lithographic printing plate precursors of Invention Examples 1 to 19 did not cause the blooming phenomenon.

The invention has been described in detail with particular reference to certain preferred embodiments thereof, but it will be understood that variations and modifications can be effected within the spirit and scope of the invention.

The invention claimed is:

1. A negative-working, infrared radiation-sensitive lithographic printing plate precursor comprising:
   a substrate having a hydrophilic surface, and
   an infrared radiation-sensitive imageable layer that is disposed over the hydrophilic surface of the substrate, and that comprises:
      a free radically polymerizable compound;
      an initiator composition that provides free radicals upon exposure to infrared radiation;
      an infrared radiation absorber;
      a primary polymeric binder comprising polyalkylene oxide segments and is present in the form of particles having an average particle size ($D_1$) of at least 50 nm and up to and including 1000 nm; and
      a secondary resin that is present as particles having an average particle size ($D_2$) of at least 3 μm and up to and including 10 μm,
   wherein:
   the infrared radiation-sensitive imageable layer has an average dry thickness (t) of at least 1 μm and up to and including 4 μm and satisfies the following Equation (1):

$$D_2/1.4 > t > D_1 \qquad (1)$$

and the average dry thickness (t) is defined by the following Equation (2):

$$t = w/r \qquad (2)$$

wherein w is the dry coverage of the infrared radiation-sensitive imageable layer in g/m² and r is 1 g/cm³.

2. The negative-working, infrared radiation-sensitive lithographic printing plate precursor of claim 1, wherein the primary polymeric binder comprises recurring units comprising polyalkylene oxide segments and recurring units comprising pendant cyano groups.

3. The negative-working, infrared radiation-sensitive lithographic printing plate precursor of claim 1, wherein the infrared radiation-sensitive imageable layer further satisfies the following Equation (3):

$$D_2/2 > t > D_1.$$

4. The negative-working, infrared radiation-sensitive lithographic printing plate precursor of claim 1, wherein the infrared radiation-sensitive imageable layer further satisfies the following Equation (IV):

$$D_2/2 > t > 2D_1.$$

5. The negative-working, infrared radiation-sensitive lithographic printing plate precursor of claim 1, wherein the initiator composition comprises a compound comprising a tetraaryl borate anion.

6. The negative-working, infrared radiation-sensitive lithographic printing plate precursor of claim 1, wherein the initiator composition comprises an iodonium cation and a tetraphenyl borate anion.

7. The negative-working, infrared radiation-sensitive lithographic printing plate precursor of claim 1, wherein the secondary resin particles comprise a crosslinked polymer.

8. The negative-working, infrared radiation-sensitive lithographic printing plate precursor of claim 7, wherein the secondary resin particles are composed of recurring units derived from one or more ethylenically unsaturated polymerizable monomers selected from the group consisting of an alkyl acrylate, alkyl methacrylate, and a styrene monomer.

9. The negative-working, infrared radiation-sensitive lithographic printing plate precursor of claim 1, wherein the secondary resin particle is present in the infrared radiation-sensitive imageable layer in an amount of at least 1 weight % and up to and including 15 weight %, based on the total solids of the infrared radiation-sensitive imageable layer.

10. The negative-working, infrared radiation-sensitive lithographic printing plate precursor of claim 1, wherein the primary polymeric binder is present in the infrared radiation-sensitive imageable layer in an amount of at least 25 weight % and up to and including 70 weight %, based on the total solids of the infrared radiation-sensitive imageable layer.

11. A method for providing a lithographic printing plate, the method comprising:
   imagewise exposing the negative-working, infrared radiation-sensitive lithographic printing plate precursor of claim 1 to infrared radiation to provide exposed regions and non-exposed regions in the infrared radiation-sensitive imageable layer, and
   removing the non-exposed regions in the infrared radiation-sensitive imageable layer from the substrate on-press using a fountain solution, lithographic printing ink, or both fountain solution and lithographic printing ink, to provide a lithographic printing plate.

* * * * *